(12) United States Patent
Fu et al.

(10) Patent No.: US 7,189,957 B2
(45) Date of Patent: Mar. 13, 2007

(54) METHODS TO IMPROVE PHOTONIC PERFORMANCES OF PHOTO-SENSITIVE INTEGRATED CIRCUITS

(75) Inventors: Shih-Chi Fu, Taipei (TW); Yuan-Hung Liu, Hsinchu (TW); Kuo-Yin Lin, Jhubei (TW); Feng-Jia Shiu, Hsinchu (TW); Chia-Shiung Tsai, Awaiting (TW); Ching-Sen Kuo, Taipei (TW); Jieh-Jang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 71 days.

(21) Appl. No.: 10/906,604

(22) Filed: Feb. 25, 2005

(65) Prior Publication Data

US 2006/0192083 A1 Aug. 31, 2006

(51) Int. Cl.
*H01L 31/00* (2006.01)
*H01L 21/00* (2006.01)

(52) U.S. Cl. .............................. 250/214.1; 250/208.1; 257/432

(58) Field of Classification Search ............. 250/208.1, 250/214.1; 257/432, 437
See application file for complete search history.

(56) References Cited

U.S. PATENT DOCUMENTS

| | | | |
|---|---|---|---|
| 4,632,522 A | 12/1986 | Ishitani | |
| 5,177,581 A * | 1/1993 | Kubo et al. | 257/437 |
| 5,731,899 A | 3/1998 | Meyers | |
| 5,812,322 A | 9/1998 | Meyers | |
| 6,130,422 A * | 10/2000 | Bawolek et al. | 250/208.1 |
| 6,654,175 B2 | 11/2003 | Brophy et al. | |
| 6,737,626 B1 | 5/2004 | Bidermann et al. | |
| 6,803,249 B2 * | 10/2004 | Thomas et al. | 438/59 |
| 6,833,601 B2 * | 12/2004 | Murakami | 257/437 |
| 6,881,941 B1 * | 4/2005 | Janesick | 250/208.1 |
| 6,884,651 B2 * | 4/2005 | Toyoda et al. | 438/72 |

* cited by examiner

*Primary Examiner*—Stephone B. Allen
(74) *Attorney, Agent, or Firm*—Baker & McKenzie LLP (57) ABSTRACT

Described is a light-directing feature formed in the inter-level dielectric (ILD) layer in combination with an anti-reflective (AR) layer to effectively and simultaneously increase quantum efficiency and cross-talk immunity thereby improving photonic performances of photo-sensitive integrated circuits. A plurality of photosensor cells is formed on a semiconductor substrate. An AR layer is subsequently formed on the plurality of photosensor cells, the AR layer being substantially non-reflective of incident light. An ILD layer is then formed over the AR layer, the ILD layer comprising a plurality of light-directing features formed in openings in the ILD layer over the AR layer above and about certain of the plurality of photosensor cells.

18 Claims, 10 Drawing Sheets

METHODS TO IMPROVE PHOTONIC PERFORMANCES OF PHOTO-SENSITIVE INTEGRATED CIRCUITS

FIELD OF ACTIVITY

Described is a light-directing feature formed in the inter-level dielectric layer in combination with an anti-reflective layer to improve photonic performances of photo-sensitive integrated circuits and methods of manufacturing thereof.

BACKGROUND OF THE INVENTION

Photo-sensitive integrated circuits such as image sensors and color filters play an important role in capturing photonic signals in optical electronic devices. These integrated circuits have been found in consumer electronics and portable devices such as digital cameras, digital camcorders, and cellular phones. The basics of a complementary metal oxide semiconductor (CMOS) image sensor involves light being collected by microlenses, passing through color filters, passivation layers, inter-metal dielectric (IMD) layers, inter-level dielectric (ILD) layers, and finally being accepted through n-type or p-type photosensor cells. The photosensor cells then transform the photonic energy into electrical signals. In addition to CMOS image sensors, other popular image sensors include charge coupled devices (CCD) and charge injection devices (CID). Red/green/blue (RGB) color filters, cyan/magenta/yellow (CMY) color filters, cyan/magenta/yellow/grey (CMYG) color filters, and grey (G) color filters are also widely utilized.

Quantum efficiency (photon responsiveness) and cross-talk immunity (noise signal from scattered light) are two of the critical factors in determining the photonic performance of photo-sensitive integrated circuits. One of the ways of boosting quantum efficiency, and therefore the optical sensitivity of the device, is to decrease the thickness of back-end-of-line (BEOL) dielectric layers, thereby decreasing the pathway and the amount of material that the incident light has to travel in order to reach the photosensor cells. However, decreasing the thickness of BEOL dielectric layers becomes process limited, as present CMOS image sensor technology require at least two layers of metal interconnects.

Another way of boosting quantum efficiency is to add an extra microlens layer in the integrated circuit interconnects as described in any of the following U.S. Pat. Nos. 6,654,175; 5,812,322; 5,731,899 and 4,632,522. The extra microlens concentrates the incident light to specific locations, thereby increasing quantum efficiency and photon responsiveness of the photo-sensitive integrated circuit. Furthermore, it also increases cross-talk immunity by reducing noise signals from scattered light. However, as pixel areas in future generations of photo-sensitive integrated circuit shrink (e.g. pixel area in 0.13 micron generation is approximately half of that in 0.18 micron generation), the benefits of the extra microlens layer are nullified by the thickness of the dielectric material required to encapsulate the extra microlens layer.

Still another way of boosting cross-talk immunity is to build air gaps or metal guard rings above and around the photosensor cells as described in U.S. Pat. No. 6,737,626. The air gaps or metal guard rings boosts cross-talk immunity between neighboring photosensor cells by decreasing the field angle of the incident light thereby limiting the noise signal from scattered light. However, the technology also decreases the quantum efficiency at the same time by preventing the photosensor cells from collecting residual photon energies from scattered light.

SUMMARY OF THE INVENTION

Described is a light-directing feature formed in the inter-level dielectric (ILD) layer in combination with an anti-reflective (AR) layer to effectively and simultaneously increase quantum efficiency and cross-talk immunity thereby improving photonic performances of photo-sensitive integrated circuit. In one embodiment, a plurality of photosensor cells is formed on a semiconductor substrate. An AR layer is then formed on the plurality of photosensor cells, the AR layer being substantially non-reflective of incident light. An ILD layer is subsequently formed over the AR layer, the ILD layer comprising a plurality of light-directing features formed in openings in the ILD layer over the AR layer above and about certain of the plurality of photosensor cells.

DETAILED DESCRIPTION OF THE EMBODIMENTS

Figure 1:
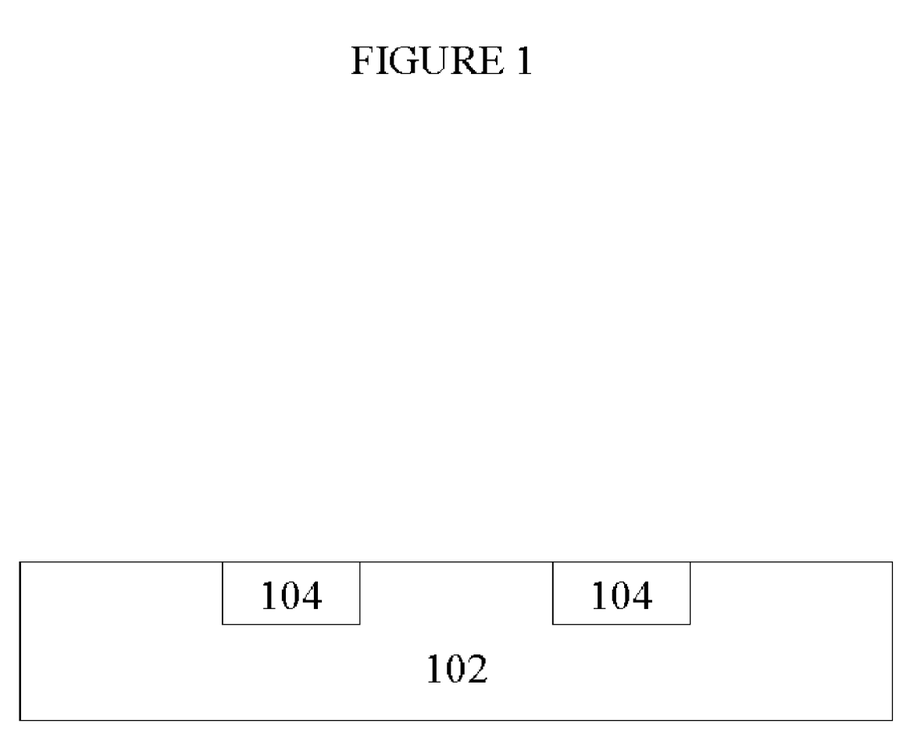
FIG. 1 is a cross-sectional view of a plurality of photosensor cells of a photo-sensitive integrated circuit on a semiconductor substrate.

Initial reference is made to a schematic cross-sectional view of a semiconductor substrate 102 with a plurality of photosensor cells 104 as illustrated in FIG. 1. The plurality of photosensor cells 104 is either n-type or p-type doped regions utilizing phosphorous or boron ions and known ion implantation techniques with mono-crystalline silicon as the semiconductor substrate 102 of choice.

Figure 2:
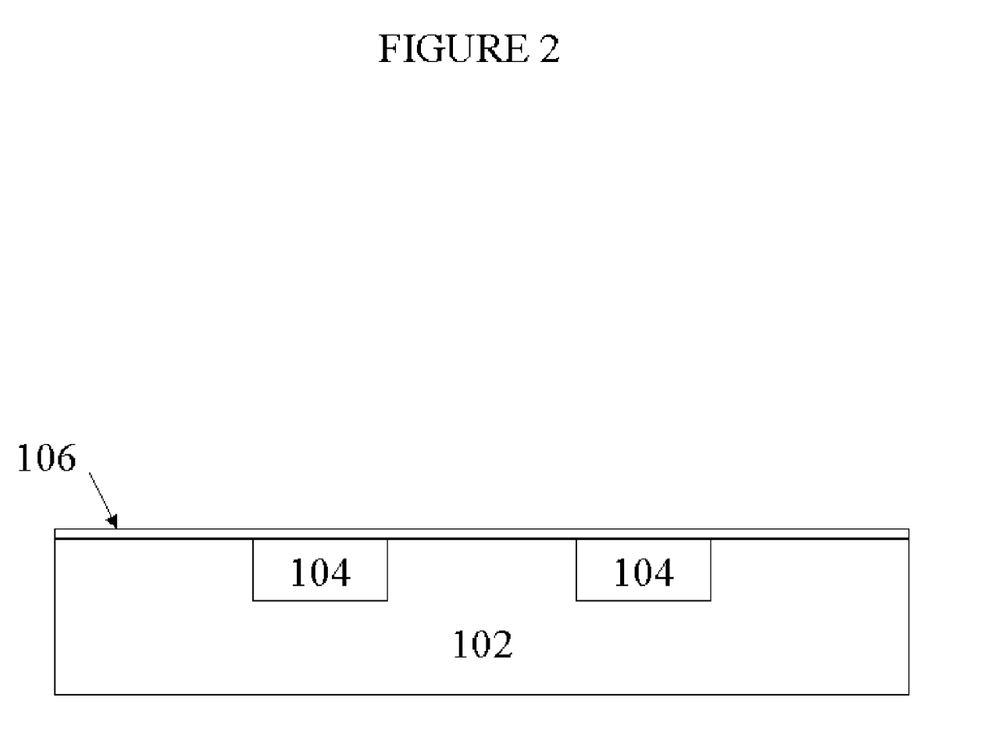
FIG. 2 is a cross-sectional view showing an anti-reflective layer on the plurality of photosensor cells.

FIG. 2 illustrates the formation of an anti-reflective (AR) layer 106 on the semiconductor substrate 102 over the plurality of photosensor cells 104. The AR layer 106 is a dielectric film like silicon oxide, aluminum oxide, titanium oxide, tantalum oxide, silicon nitride, or silicon-oxynitride with a film thickness of integer multiples of quarter-lambda $(m(\lambda)/4n)$, where m is an integer number, $\lambda$ corresponds to the wavelength of incident light on the AR layer 106, and n is the index of refraction of the AR layer 106. For example, if the incident light on the AR layer 106 has a wavelength of 600 nm, and the index of refraction of the AR layer 106 is 2.0, then the film thickness equals 600 nm/(4×2.0)=75 nm (750 Å), with m=1. Furthermore, the AR film thickness 106 could also be integer multiples of 75 nm, such as 150 nm with m=2,225 nm with m=3, and so forth. Due to the design of the AR layer 106, incident or scattered light that strikes the AR layer 106 are prevented from reflecting off the surface of the semiconductor substrate 102 and back into the photo-sensitive interconnects. In addition, any residual reflected rays from both interfaces of the AR layer 106 may also be cancelled by destructive interference.

Figure 3A:
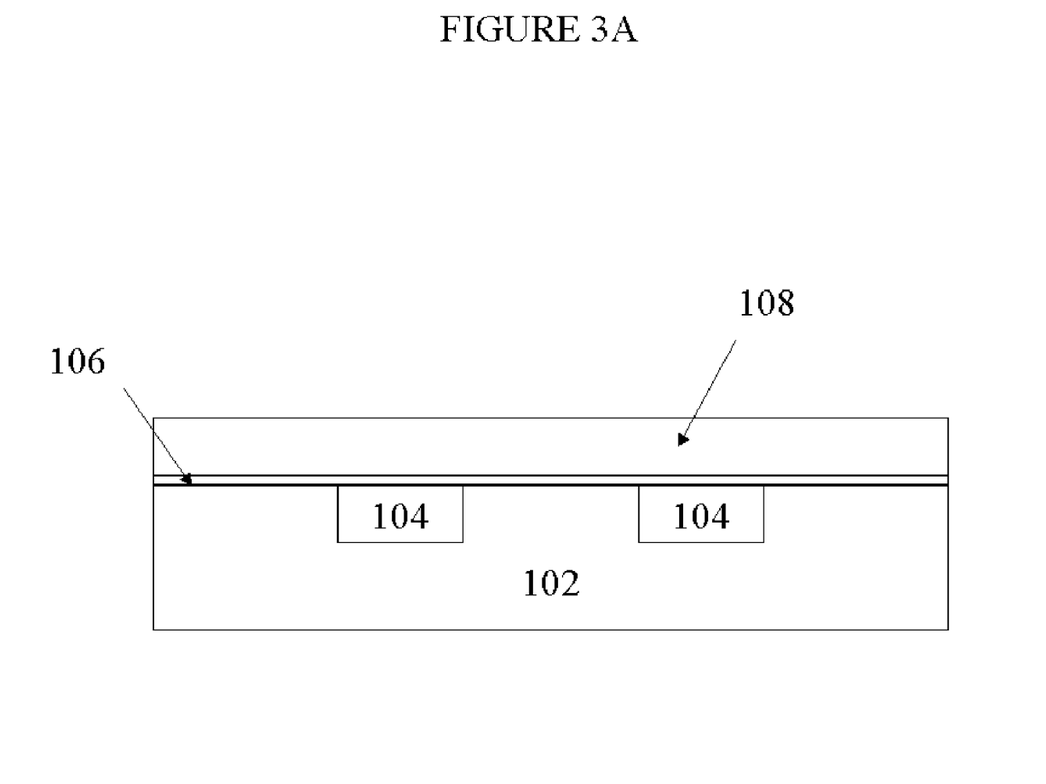
FIGS. 3A–3B is a cross-sectional view in which an inter-level dielectric layer is formed having openings above and about certain of the plurality of photosensor cells.
Figure 3B:
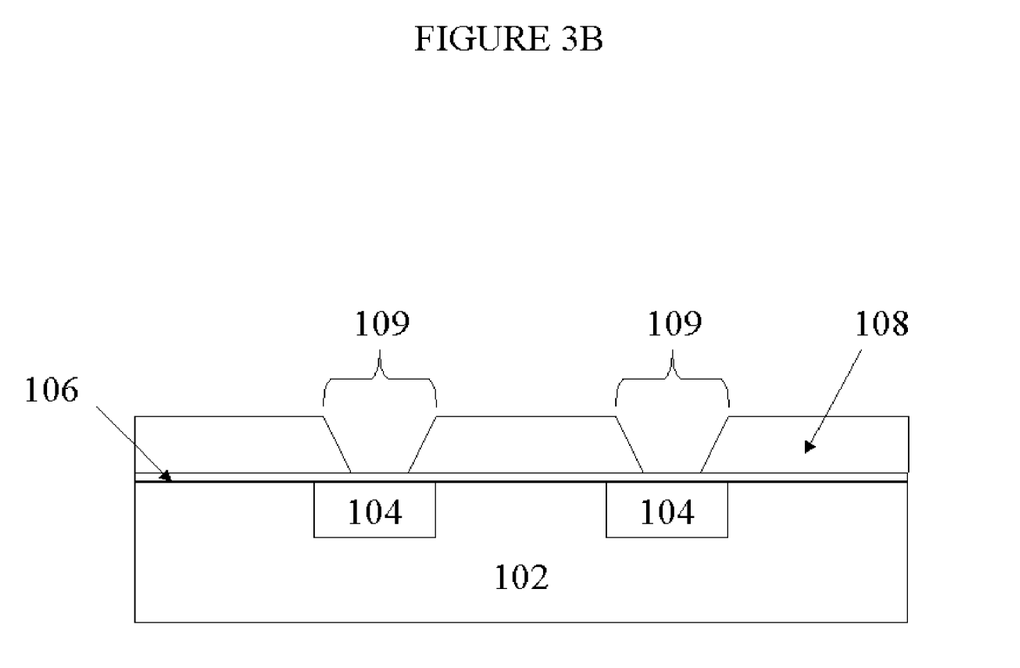

An inter-level dielectric (ILD) layer 108 is subsequently formed over the AR layer 106 as illustrated in FIG. 3A employing known plasma deposition techniques and utilizing known materials such as silicon oxide, silicon nitride, or undoped silicate glass (USG). Furthermore, employing methods and materials as are conventional in the art of integrated circuit fabrication, in particular photolithography and dry etching, a plurality of openings 109 may be formed in the ILD layer 108 over the AR layer 106 above and about certain of the plurality of photosensor cells 104 as illustrated in FIG. 3B. The openings 109 may have greater openings at the top than at the bottom (concave-like in shape) or have greater openings at the bottom than at the top (convex-like in shape) depending on the fabrication process and the methods and techniques of dry etching.

Figure 4A:
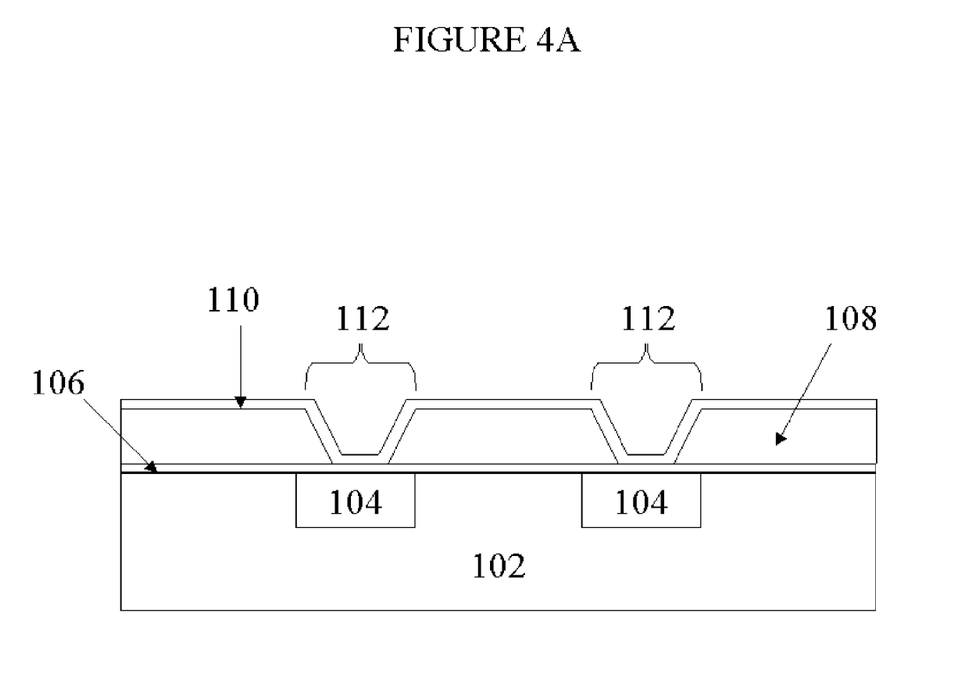
FIGS. 4A–4B illustrate the cross-sectional view of the intermediate structure of FIGS. 3A–3B upon which a plurality of light-directing features has been formed.
Figure 4B:
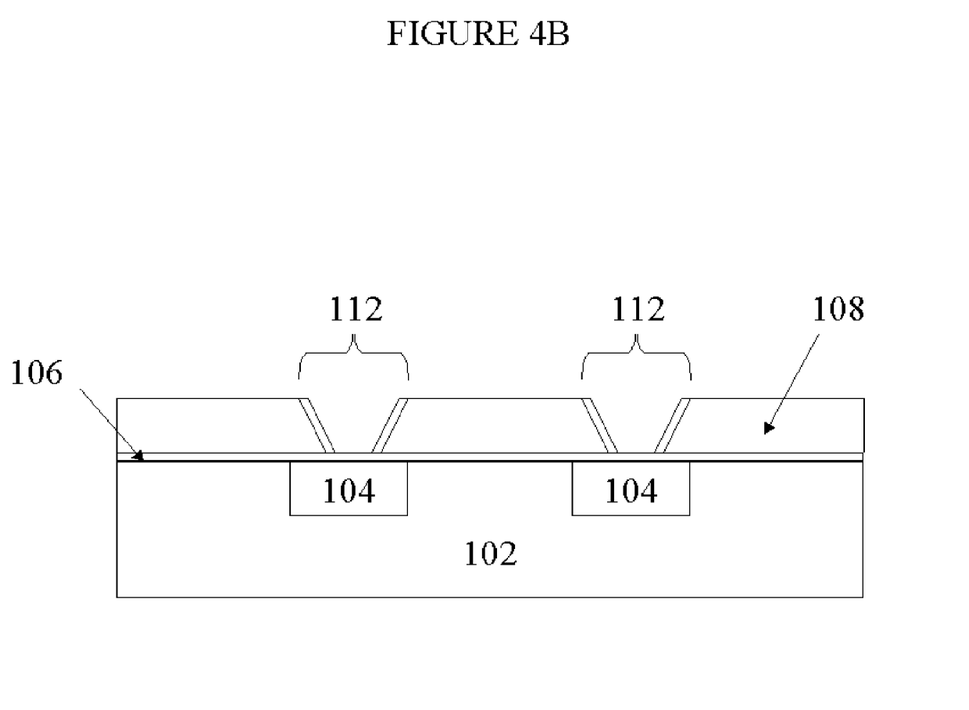

A plurality of light-directing features 110 is then deposited over the entire semiconductor substrate 102 employing known techniques and provides conformal coverage over the ILD layer 108 including the plurality of ILD openings 109 as illustrated in FIG. 4A. As a result of the plurality of ILD openings 109, a plurality of light-directing features in the shape of the ILD openings 112 is formed. The plurality of light-directing features 110 and the plurality of light-directing features in the shape of the ILD openings 112 may either be a metallic film such as titanium nitride (TiN), titanium (Ti), or tungsten (W), or a dielectric film such as silicon oxide, aluminum oxide, titanium oxide, tantalum oxide, silicon nitride, or silicon-oxynitride. The plurality of light-directing features in the shape of the ILD openings 112 may also be an evacuated air gap depending on the fabrication process and the methods and techniques of dry etching. By employing methods and materials as are conventional in the art of integrated circuit fabrication, in particular photolithography and dry etching, the plurality of light-directing features 110 may be etched away from the ILD layer 108 leaving only the plurality of light-directing features in the shape of the ILD openings 112 as illustrated in FIG. 4B. Consequently, a plurality of light-directing features in the shape of the ILD openings 112 are formed in the ILD layer 108 over the AR layer 106 above and about certain of the plurality of photosensor cells 104.

Figure 5A:
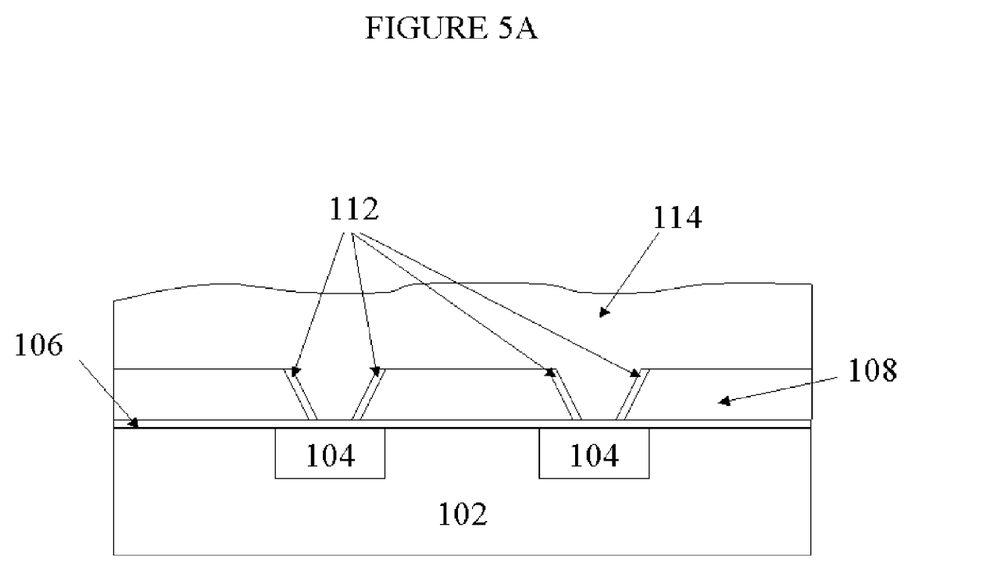
FIGS. 5A–5B illustrate the cross-sectional view of the intermediate structure of FIGS. 4A–4B upon which the inter-level dielectric layer has been planarized.

To facilitate further semiconductor processing, an ILD film 114 is blanket deposited over the wafer using known techniques as illustrated in FIG. 5A. The ILD film 114 has the same or similar properties as those employed in the ILD layer 108. After employing methods and materials as are conventional in the art of integrated circuit fabrication, in particular chemical mechanical polishing (CMP), both the ILD film 114 and the ILD layer 108 are planarized, meaning that their topography has been smoothed, as illustrated in FIG. 5B.

Figure 6:
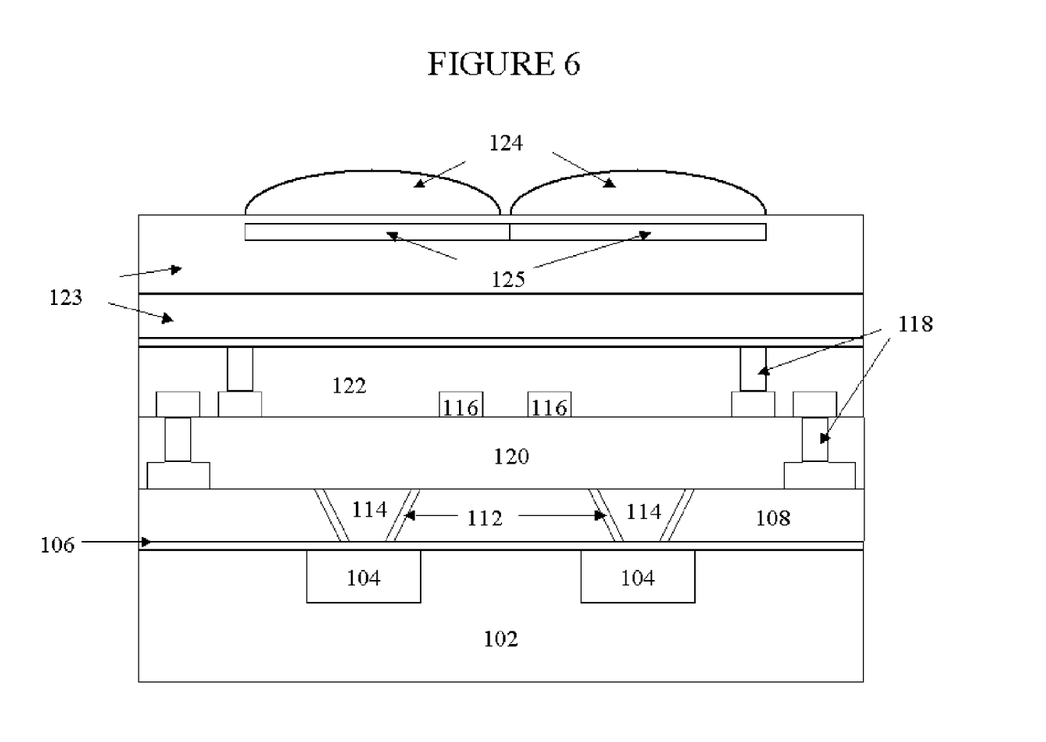
FIG. 6 is a cross-sectional view of a completed photo-sensitive integrated circuit.

Once planarized, further back-end-of-line (BEOL) processing may be employed utilizing known methods and materials. FIG. 6 is a cross-sectional view of a completed photo-sensitive integrated circuit employing the present invention with color filters 125, first inter-metal dielectric (IMD-1) layer 120, second inter-metal dielectric (IMD-2) layer 122, electrical connections provided by metal interconnects 118, and optical sensitivity and flexibility enhancements provided by microlenses 124.

Figure 5B:
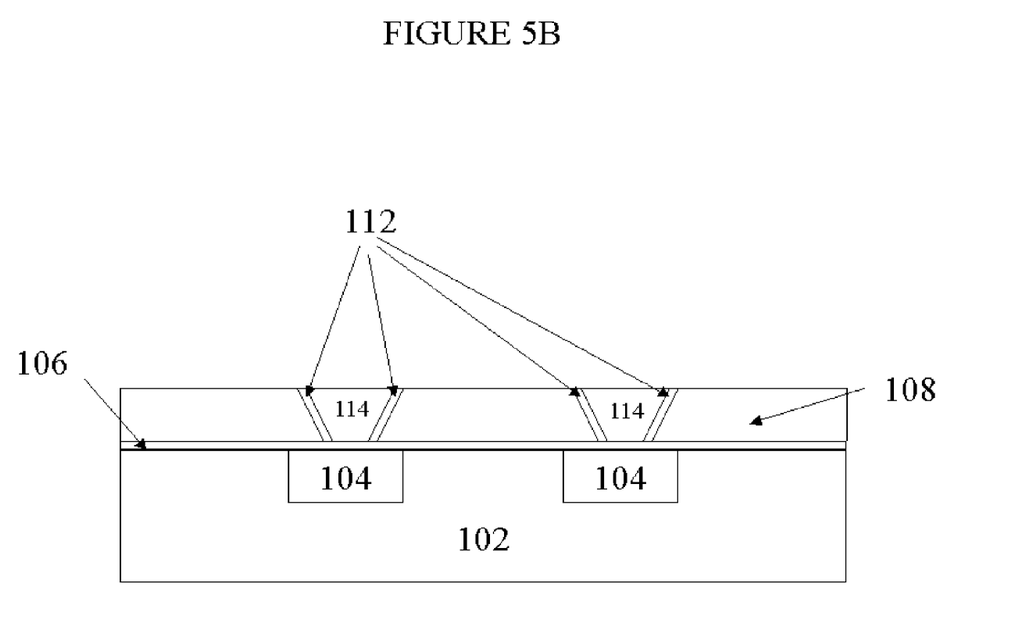

From the intermediate structure of FIG. 5B, an IMD-1 layer 120 may be formed over the entire semiconductor substrate 102 employing known plasma deposition techniques and utilizing known materials such as silicon oxide, silicon nitride, or undoped silicate glass (USG). Furthermore, employing methods and materials as are conventional in the art of integrated circuit fabrication, in particular photolithography, dry etching, and metal deposition, a plurality of openings may be formed in the IMD-1 layer 120 where a plurality of conductor pixels 116 may be formed above and around certain of the plurality of photosensor cells 104 as illustrated in FIG. 6. Conductor pixels 116 are metallic photo-sensitive diodes formed employing known metallic materials such as aluminum, gold, copper, or tungsten. The plurality of photo-sensitive conductor pixels 116 serve as the first directional charge collection in storing and receiving incoming signals, where the signals may consist of images or light photons.

In addition, a plurality of metal interconnects 118 may also be formed on and around certain of the plurality conductor pixels 116 employing metal deposition techniques and materials such as aluminum, gold, copper, or tungsten. The plurality of metal interconnects 118 facilitate the transmission of signals that are stored in the plurality of conductor pixels 116 to the IMD-2 layer 122 as illustrated in FIG. 6. Furthermore, the metal interconnects 118 also route electrical signals converted by the plurality of photosensor cells 104 and the plurality of conductor pixels 116 out to bond pads (not shown) thereby easing the photo-sensitive integrated circuit for packaging onto a device circuit board.

Finally, to facilitate further processing, the IMD-1 layer 120 is planarized employing methods and materials as are conventional in the art of integrated circuit fabrication, in particular chemical mechanical polishing (CMP). Once planarized, meaning that the topography has been smoothed, additional processing may further proceed with ease.

The IMD-2 layer 122 is subsequently formed over the IMD-1 layer 120 as illustrated in FIG. 6. The IMD-2 layer 122 and the plurality of conductor pixels 116 within this layer may be formed utilizing the processing steps as described earlier. The additional IMD-2 layer 122 adds additional plurality of conductor pixels 116 for increased photon sensitivity and increased functionality to improve photo-sensitive integrated circuit performance. Furthermore, additional inter-metal dielectric (IMD) layers may be formed.

Additional passivation layers 123 are formed over the IMD-2 layer 122 and the IMD-1 layer 120 for purposes of planarizing the photo-sensitive integrated circuit and increasing the ease of packaging. A plurality of color filters 125 is subsequently formed within the passivation layers 123 above and about the photosensor cells 104 employing methods and materials as are conventional in the art of integrated circuit fabrication as illustrated in FIG. 6. The plurality of color filters 125 may also be arranged in unique patterns above and about the plurality of photosensor cells 104 to form color filter arrays to achieve the desired sensitivity and performance characteristics. Each color filter 125 may be constructed such that a single color is assigned to each photosensor cell 104 and that each photo-sensitive cell 104 responds to only one color wavelength. A plurality of microlenses 124 are then formed above the plurality of color filters 125 employing methods and materials as are conventional in the art of integrated circuit fabrication with the purpose of enhancing optical sensitivity and providing optical flexibility as described in any of the following U.S. Pat. Nos. 6,531,266; 6,274,917; 6,242,277 and 6,171,885.

The basics of a CMOS image sensor starts with the initial photonic signals, whether image or light, being collected and enhanced by microlenses 124. The microlenses 124 may be either concave or convex depending on the application of the photo-sensitive integrated circuit. The light accumulated and concentrated by the microlenses 124 subsequently passes through the color filters 125 where specific wavelengths of light are filtered. Once filtered, the light then passes through the passivation layers 123, the IMD-2 layer 122, and the IMD-1 layer 120, where it may be collected by any number of conductor pixels 116 located within these layers. The light that is not collected will then continue onto the ILD film 114 and the ILD layer 108 where it may then be collected by the photosensor cells 104. All of the photons collected are then eventually transformed into electrical signals and routed out to bond pads (not shown) by metal interconnects 118 for ease of assembly and packaging.

Figure 7:
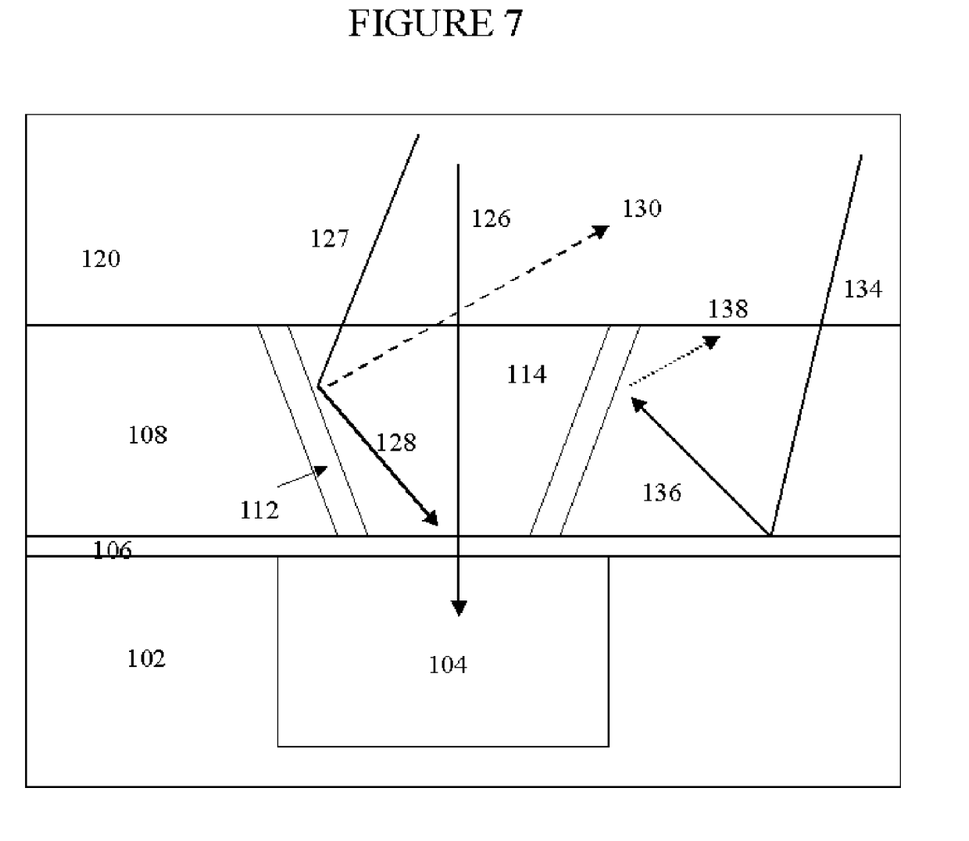
FIG. 7 is a cross-sectional view illustrating the simultaneous benefits of the light-directing feature formed in the inter-level dielectric layer in conjunction with the anti-reflective layer in a photo-sensitive integrated circuit.

Benefits realized by the present embodiments are illustrated in FIG. 7. As perpendicular on-axis incident light 126 enters IMD-1 layer 120 and ILD film 114, it passes through the plurality of light-directing features in the shape of the ILD openings 112 undisturbed and into the photosensor cells 104. The on-axis incident light 126 is defined as all light photons or signals that enter the photo-sensitive integrated circuit perpendicularly at right angles (90 degrees) with respect to the plurality of photosensor cells 104. The photosensor cells 104 then readily collect and transform the photon energy into electrical signals. As non-perpendicular off-axis incident light 127 enters IMD-1 layer 120 and ILD film 114, it reflects off the plurality of light-directing features in the shape of the ILD openings 112 and the resulting reflected light 128, like that of on-axis incident light 126, is also readily collected and transformed by the photosensor cells 104. The off-axis incident light 127 is defined as all light photons or signals that enter the photo-sensitive integrated circuit at oblique angles (angles that are not right angles) with respect to the plurality of photosensor cells 104. Other reflected light 130 not collected reflects back through to IMD-1 layer 120 or IMD-2 layer 122 (not shown) and may be picked up by the color filters 125 (not shown). In doing so, the plurality of light-directing features in the ILD openings 112 above and about certain of the plurality of photosensor cells 104 increase the photosensor cells' 104 field of view and allow them to capture and concentrate a greater amount of incoming photons into the image sensor. Furthermore, with the increased focus, a design margin may be built into the structure such that the light is substantially confined to a center portion of the photosensor cells 104, whereby the sensitivity of the design to process variations and achromatic effects may be diminished or mitigated in large measure. The quantum efficiency of the present embodiment can accordingly be much improved compared to that of previous devices.

In addition to increasing quantum efficiency and photon responsiveness, the plurality of light-directing features in the shape of the ILD openings 112 also increases cross-talk immunity by serving as photon isolators and minimizing potential noise signals from neighboring plurality of photosensor cells 104, when implemented in combination with an AR layer 106. Cross talk is the picking up of stray photonic signals transmitted by a neighboring cell where the stray signals can interfere with and reduce photon sensitivity. In order to increase cross-talk immunity and boost photon sensitivity, stray photonic signals from neighboring cells must be minimized and isolated. As illustrated in FIG. 7, when stray light 134 enters IMD-1 layer 120 and ILD layer 108, it is reflected off the AR layer 106. The once-reflected light 136, in turn strikes the plurality of light-directing features in the shape of the ILD openings 112, and is substantially reflected and isolated as the twice-reflected light 138 by the plurality of light-directing features in the shape of the ILD openings 112. The plurality of light-directing features in the shape of the ILD openings 112 minimizes cross-talk interference by isolating the twice-reflected light 138 and preventing it from straying into a neighboring plurality of photosensor cell 104. The plurality of light-directing features in the shape of the ILD openings 112 are realized by the increased quantum efficiency and the increased cross-talk immunity.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. §1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary of the Invention" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A photo-sensitive integrated circuit comprising:
   a semiconductor substrate;
   a plurality of photosensor cells on the semiconductor substrate;
   an anti-reflective (AR) layer formed on the plurality of photosensor cells, the AR layer being substantially non-reflective of incident light;
   an inter-level dielectric (ILD) over the AR layer, the ILD layer comprising a plurality of openings defined in it, each opening formed in the ILD layer over the AR layer above and about certain of the plurality of photosensor cells; and
   a plurality of light-directing features formed on sidewalls of the plurality of openings.

2. A device according to claim 1 wherein the openings are defined such that they have a greater area at the top than at the bottom.

3. A device according to claim 1, wherein the light-directing features are reflective layers formed on the sidewalls of the openings and are operable to direct light to the photosensor cells that enters the openings at right angles and at oblique angles.

4. A device according to claim 1, wherein the light-directing feature is an evacuated air gap.

5. A device according to claim 1, wherein the anti-reflective layer has a film thickness of integer multiples of quarter-lambda (m(λ)/4n), where m is an integer number, lambda (λ) is the wavelength of the expected incident light on the AR layer, and n is the index of refraction of the AR layer.

6. A device according to claim 1, wherein the light-directing features are formed substantially of a metallic film.

7. A device according to claim 6, wherein the metallic film is selected from the group consisting of titanium nitride (TiN), titanium (Ti), and tungsten (W).

8. A device according to claim 1, wherein the anti-reflective layer is formed substantially of a dielectric material.

9. A device according to claim 8, wherein the dielectric material is selected from the group consisting of silicon oxide, aluminum oxide, titanium oxide, tantalum oxide, silicon nitride, and silicon-oxynitride.

10. A method of manufacturing a photo-sensitive integrated circuit comprising:
   forming a plurality of photosensor cells on the semiconductor substrate;
   forming an anti-reflective (AR) layer on the plurality of photosensor cells, the AR layer being substantially non-reflective of incident light;
   forming an inter-level dielectric (ILD) over the AR layer;
   forming a plurality of openings in the ILD layer over the AR layer above and about certain of the plurality of photosensor cells; and
   forming a plurality of light-directing features on sidewalls of the plurality of openings.

11. A method according to claim 10, wherein forming a plurality of openings comprises forming the openings with a greater area at the top than at the bottom of each opening.

12. A method according to claim 10, wherein forming light-directing features comprises forming reflective layers that are operable to direct light to the photosensor cells that enters the openings at right angles and at oblique angles.

13. A method according to claim 10, wherein forming light-directing features comprises forming an evacuated air gap.

14. A method according to claim 10, wherein forming an anti-reflective layer comprises forming a film with a thickness of integer multiples of quarter-lambda (m(λ)/4n), where m is an integer number, lambda (λ) is the wavelength of the expected incident light on the AR layer, and n is the index of refraction of the AR layer.

15. A method according to claim 10, wherein forming light-directing features comprises forming substantially a metallic film.

16. A method according to claim 15, wherein the metallic film is selected from the group consisting of titanium nitride (TiN), titanium (Ti), and tungsten (W).

17. A method according to claim 10, wherein forming an anti-reflective layer comprises forming a substantially dielectric material.

18. A method according to claim 17, wherein the dielectric material is selected from the group consisting of silicon oxide, aluminum oxide, titanium oxide, tantalum oxide, silicon nitride, and silicon-oxynitride.

* * * * *